United States Patent [19]

Shimada et al.

[11] Patent Number: 4,724,283

[45] Date of Patent: Feb. 9, 1988

[54] MULTI-LAYER CIRCUIT BOARD HAVING A LARGE HEAT DISSIPATION

[75] Inventors: Yuzo Shimada; Yasuhiro Kurokawa; Kazuaki Utsumi, all of Tokyo, Japan

[73] Assignee: NEC Corporation, Tokyo, Japan

[21] Appl. No.: 912,537

[22] Filed: Sep. 29, 1986

[30] Foreign Application Priority Data

Sep. 27, 1985 [JP] Japan .................... 60-215351

[51] Int. Cl.[4] .............................. H05K 1/00
[52] U.S. Cl. .................... 174/68.5; 361/411; 361/414
[58] Field of Search ............... 174/68.5; 361/411, 414; 264/61

[56] References Cited

U.S. PATENT DOCUMENTS

| | | | |
|---|---|---|---|
| 3,770,529 | 11/1973 | Anderson | 174/68.5 |
| 4,328,531 | 5/1982 | Nagashima et al. | 361/414 X |
| 4,336,088 | 6/1982 | Hetherington et al. | 361/411 X |
| 4,465,727 | 8/1984 | Fujita et al. | 174/68.5 X |
| 4,578,365 | 3/1986 | Huseby et al. | 264/61 X |
| 4,598,167 | 7/1986 | Ushifusa et al. | 174/68.5 |

Primary Examiner—Morris H. Nimmo
Attorney, Agent, or Firm—Burns, Doane, Swecker & Mathis

[57] ABSTRACT

A multi-layer circuit board is disclosed which includes a plurality of AlN ceramic layers stocked and combined as an integrated form and wiring layers interposed at different levels between the AlN ceramic layers. The wiring layers are made of a mixture of tungsten and AlN ceramic particles, the content of the AlN ceramic particles being 0.5 to 2.0 wt. %. A plurality of through-holes are formed in the AlN ceramic layers to interconnect the wiring layers formed at different levels.

7 Claims, 3 Drawing Figures

MULTI-LAYER CIRCUIT BOARD HAVING A LARGE HEAT DISSIPATION

BACKGROUND OF THE INVENTION

1. Field of the Invention

The present invention relates to a multi-layer circuit board used for mounting one or more semiconductor chips such as LSI's (Large Scale Integrated Circuits).

2. Description of the Related Art Including Information Disclosed Under §§ 1.97–1.99

LSI chips having a high integration density and operable at high speed consume a large power and require a large heat dissipation for their mounting structure. Alumina ceramics has been proposed to be used as boards for mounting such LSI chips in A. J. Blodgett, Jr. "A Multi-layer Ceramic, Multi-chip Module", IEEE Proc. of Electronics Components Conference, 1980, 283-285 and in B. T. Clark and Y. M. Hill "IBM Multichip Multilayer Ceramic Modules for LSI Chips—Design for Performance and Density", IEEE Transactions on Components, Hybrids, and Manufacturing Technology, Vol. CHMT-3, No. 1, March 1980, PP 89-93. In accordance with, however, the recent progress of LSI's, a larger heat dissipation is being required for packaging structures of the LSI's and the thermal conductivity of alumina becomes insufficient for being used in such packaging structures.

One of ceramic materials having an improved thermal conductivity is silicon carbide which is disclosed in Japanese patent application un-examined publication No. 57-180006. The silicon carbide has a resistivity of 1 to 10 ohm-cm which is still not enough to be used in the packaging structure. Berylia ceramics is another material having a large thermal conductivity. It is, however, poisonous and is not suitable to be used in an electronic device.

Recently, the use of aluminum nitride (AlN) ceramics has been proposed by Y. Kurokawa, K. Utsumi and H. Takamizawa in U.S. Pat. No. 4,650,777 which was assigned to the same assignee as the present application. AlN ceramics has characteristics generally suitable to be used in an electronic device, such as a large thermal conductivity and a high resistivity. However, Y. Kurokawa et al only suggested in the U.S. patent application to use the AlN ceramics in a semiconductor device without any concrete example of such device.

In applying the AlN ceramics to a multi-layer circuit board, the inventors of the present invention have faced some difficulties. The multi-layer circuit board interposes wiring layers between laminated layers of AlN ceramics. Since those layers are sintered at a high temperature, the wiring layers must endure the sintering process and refractory metals such as tungsten should be used therefor. However, refractory metals have a weak adhesion strength to the AlN ceramics and their coefficients of contraction are different from the AlN ceramics. Accordingly, the refractory metal wiring layers are apt to separate from the AlN ceramic layers. Such separation deteriorates the heat dissipation efficiency of the multi-layer circuit board.

SUMMARY OF THE INVENTION

It is, therefore, a primary object of the present invention to provide a multi-layer circuit board having a high heat dissipation efficiency.

It is another object of the present invention to provide a multi-layer circuit board using AlN ceramics.

The multi-layer circuit board according to the present invention includes a plurality of laminated layers of AlN ceramics, and at least one metal wiring layer interposed between the AlN ceramic layers, the metal wiring layer being made of refractory metal in which AlN ceramic particles are uniformly dispersed. The AlN ceramic layers and the metal wiring layer are adhered to one another by a sintering process. The refractory metal is preferably tungsten. The wiring layer involves AlN ceramic particles in 0.5 to 2.0 wt. %.

According to the present invention, the material of the metal wiring layer is a mixture of refractory metal and AlN ceramic particles. The AlN ceramic particles in the metal wiring layer react with the AlN ceramic layers in the sintering process to improve the adhesion strength between the metal wiring layer and the AlN ceramic layers. The coefficient of contraction of the metal wiring layer is controlled by the content of AlN ceramic particles and may have a value similar to that of the AlN ceramic layer. As a result, the adhesion between the AlN ceramic layers and the metal wiring layer is greatly improved and separation therebetween is suppressed as a result, the heat dissipation efficiency is improved. The multi-layer circuit board of the present invention is suitable to mount LSI devices thereon.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENT

Figure 1:
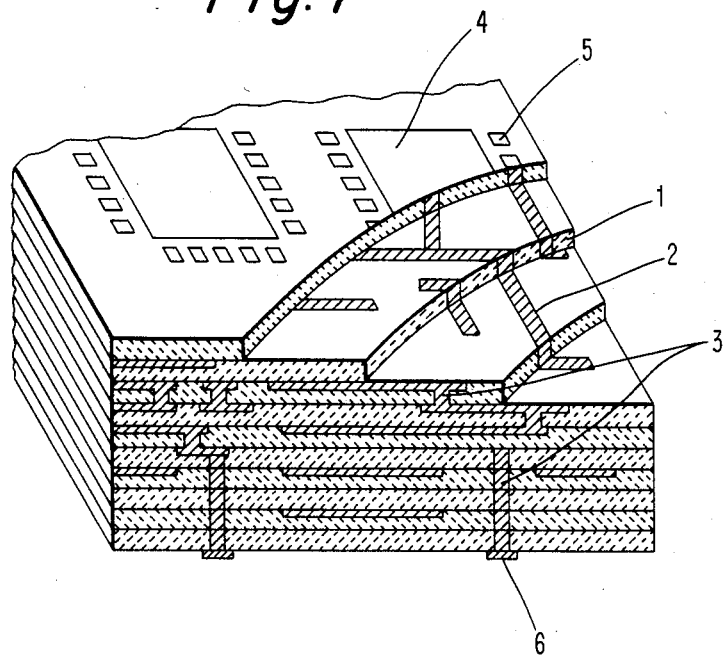
FIG. 1 is a perspective view of a preferred embodiment of the present invention.

The preferred embodiment shown in FIG. 1 comprises ten laminated AlN ceramic layers 1 and seven wiring layers 2 interposed between the AlN ceramic layers 1. The wiring layers 2 include signal lines and power lines. Through-holes 3 are formed in the AlN ceramic layers 1 and filled with a metallic material to interconnect the wiring layers 2 in different levels. The metallic material is same as that of the wiring layers 2 and made of a mixture of tungsten in 99.5 to 98 wt. % and AlN ceramic particles in 0.5 to 2.0 wt. %. On the surface of the upper-most AlN ceramic layer, die pads 4 and bonding pads 5 are formed. LSI chips (not shown) are to be attached to the die pads 4 and electrodes on the LSI chips are to be connected to the bonding pads 5 by bonding wires (not shown). The thus connected LSI chips and the wiring layers 2 constitute an electronic circuit. For signal input and output, input/output pads 6 are formed on the surface of the lowest AlN ceramic layer.

The manufacturing process of the preferred embodiment shown in FIG. 1 will be explained. Green sheets of AlN ceramics are formed from a mixture of AlN powder and $CaC_2$ powder. The $CaC_2$ powder is used to decrease the quantity of oxygen atoms in the sintered ceramics and thereby to increase thermal conductivity thereof. The AlN powder, CaC$_2$ powder and organic solvent are mixed for 48 hours. An example of the organic solvent is polycaprolactam or polyacrylate, which is easily decomposed under a neutral atmosphere. The degree of viscosity of the mixture is controlled to a value of 3,000 to 7,000 cp. The mixture is applied to a casting machine to form green sheets each having a thickness of 10 to 200 μm. Thereafter, through-holes are opened in the green sheets by punching method or by using a laser beam.

The green sheets having the through-holes are subjected to a screen printing to selectively apply a paste including a mixture of tungsten powder and AlN powder thereon to form wiring layers 2, die pads 4, bonding pads 5 and input/output pads 6 and to fill the through-holes 3. The AlN powder is uniformly distributed in the paste. Ten green sheets subjected to the screen printing are laminated in a predetermined order, and then subjected to a thermal pressure. The laminated structure is cut into a desired dimension, heated at 400° to 600° C. in a non-oxidizing atmosphere for a sufficient time to remove the solvent in the green sheets and the paste, and sintered at 1,400° to 2,000° C. in a non-oxidizing atmosphere. After the sintering process, gold is plated on the surfaces of the die pads 4, the bonding pads 5 and the input/output pads 6.

Figure 2:
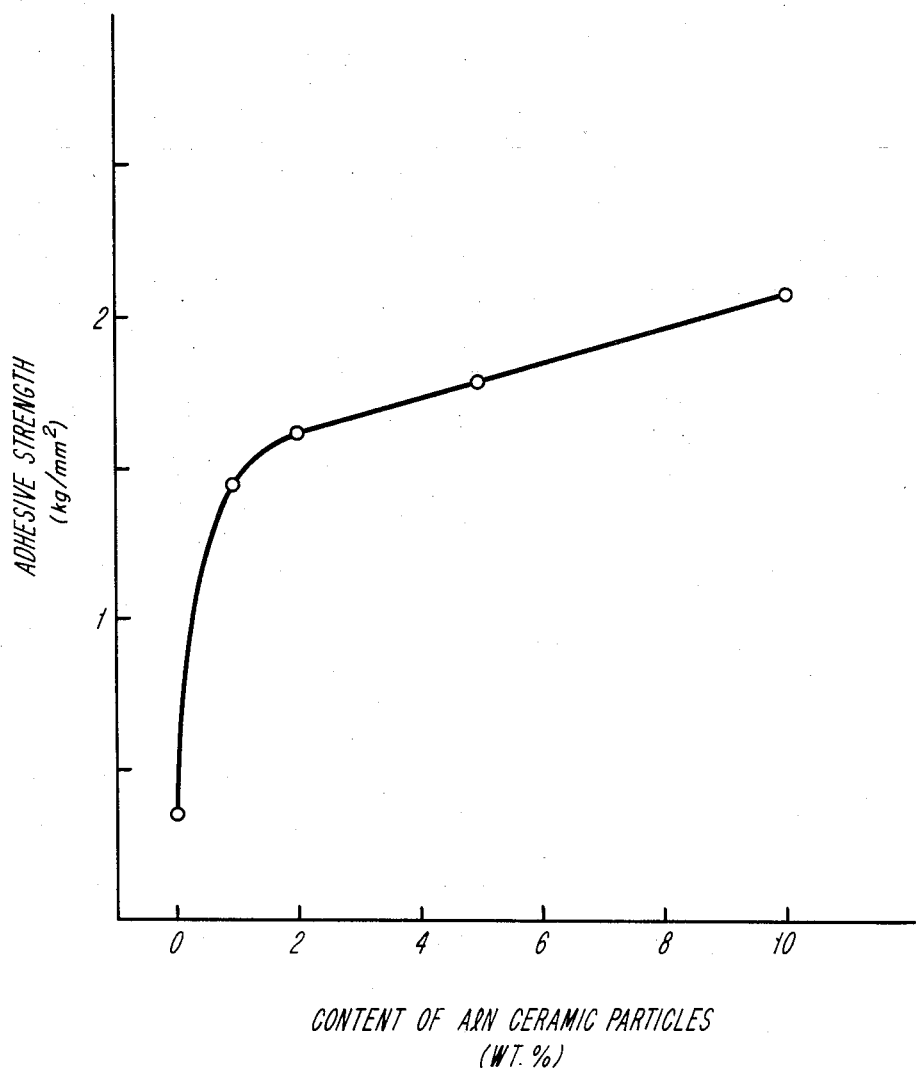
FIG. 2 is a graph showing a relationship between an adhesion strength and a content of AlN ceramic particles in a wiring layer.

Referring to FIG. 2, the addition of AlN ceramic particles to the wiring layer 2 brings about an increase in adhesion strength between the AlN ceramic layers and the wiring layers. The improvement in the adhesion strength is sharp for the content of AlN ceramic particles up to 2 wt. %. It is still remarkable for the content larger than 2 wt. %. In the wiring layer, with the content of AlN ceramic particles larger than 10 wt. %, the resistivity becomes too high to be used in the circuit board.

Figure 3:
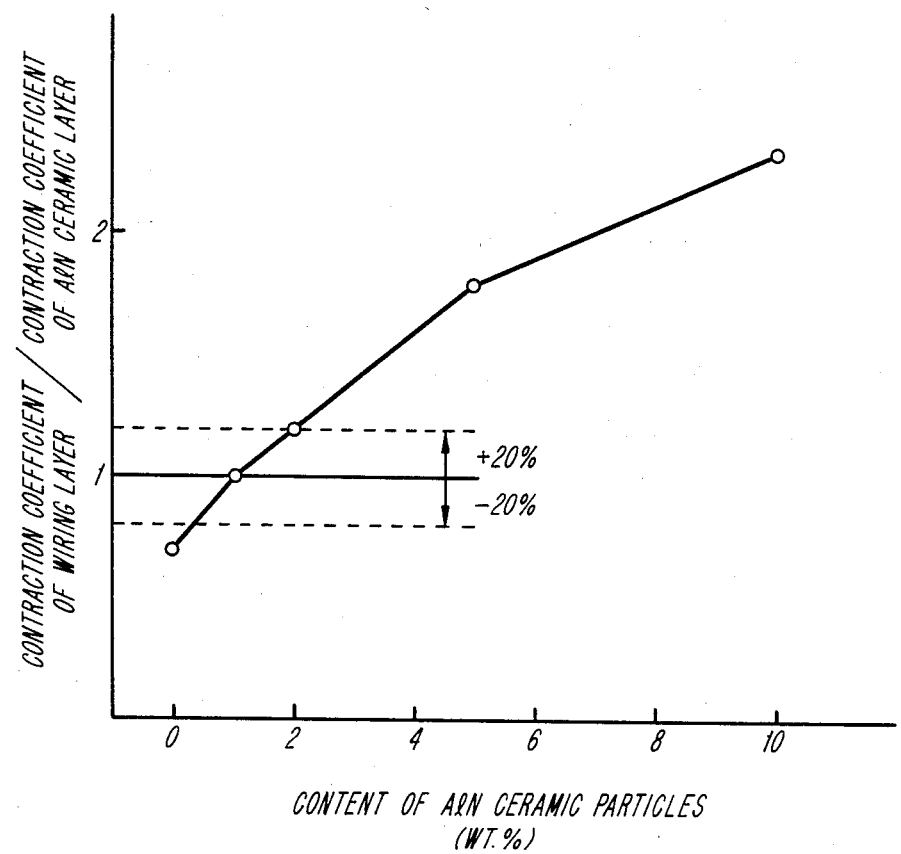
FIG. 3 is a graph showing a relationship between a ratio of the contraction coefficient of the wiring layer to that of the AlN ceramic layer and a content of the AlN ceramic particles in the wiring layer.

A ratio of the contraction coefficient of the wiring layer to that of the AlN ceramic layer is also increased by addition of AlN ceramic particles, as shown in FIG. 3. If this ratio is materialy apart from unity "1", the wiring layers 2 would be separated from the AlN ceramic layers 1 or the board would be broken to cause an open circuit in the cooling step after the sintering process. The preferable value of the ratio of the contraction coefficient is between "0.8" and "1.2" which is realized by the content of AlN ceramic particle between 0.5 and 2.0 wt. %.

In summary, the content of AlN ceramic particles uniformly contained in the metal wiring layers 2 should be selected in a range of 0.5 to 2.0 wt. %. With the AlN ceramic particles contained in the metal wiring layers in 0.5 to 2.0 wt. %, there is obtained a rigidly integrated multi-layer circuit board having no separation between AlN ceramic layers and wiring layers. The heat dissipation efficiency is improved. The fine wirings in the multi-layer circuit board are safely maintained in the sintering process.

The table shown below indicates other characteristics of the ceramic layers and the wiring layers. The resistivity of wiring layers increase by 3 to 11 μΩ·cm, compared to the wiring layers of tungsten alone. This increment, however, is small and does not damage the operation of the electrical circuit. The thermal conductivities of the AlN ceramic layers are higher than the value of alumina which is about 17 W/mK. Thermal expansion coefficients of the AlN ceramic layers are smaller than the value of alumina which is about 65×10$^{-7}$/°C., and almost the same as 35 to 40×10$^{-7}$/°C. of silicon. The AlN ceramic layers are mechanically stronger than alumina ceramic layer having a flexural strength of about 30 kg/cm$^2$. Thus, AlN ceramic layers have many features preferable to be used in a circuit board for mounting a semiconductor chip, and the present invention enables the practical application of the AlN ceramic layers.

| Content of CaC2 powder in the mixture of AlN and CaC2 powders (wt %) | paste for wiring layers | | sintering temperature (°C.) | size of wiring layers | | | resistivity of wiring layers (μΩ·cm) | thermal conductivity of AlN ceramic layers (W/mk) | flexural strength of AlN ceramic layers (kg/col) | thermal expansion coefficient of AlN ceramic layers (10$^{-7}$/°C.) |
|---|---|---|---|---|---|---|---|---|---|---|
| | metal | Content of AlN (Wt %) | | width (μm) | interval (μm) | diameter of through-holes (μm) | | | | |
| 0.5 | W | 1.0 | 1800 | 100 | 150 | 100 | 20 | 100 | 4100 | 42 |
| 1.0 | W | 1.0 | 1900 | 150 | 200 | 150 | 18 | 140 | 4700 | 41 |
| 2.0 | W | 1.0 | 1800 | 100 | 200 | 100 | 20 | 100 | 4200 | 43 |
| 1.0 | W | 2.0 | 1900 | 200 | 150 | 200 | 25 | 130 | 4500 | 42 |

What is claimed is:

1. A multi-layer circuit board comprising:
 a plurality of aluminum nitride ceramic layers; and
 at least one wiring layer formed between said aluminum nitride ceramic layers, said aluminum nitride ceramic layers and said wiring layer being integrated into a single circuit board, and said wiring layer being made of a mixture of refractory metal and aluminum nitride ceramic particles.

2. A multi-layer circuit board as claimed in claim 1, wherein at least one of said aluminum nitride ceramic layers has a through-hole filled with said mixture.

3. A multi-layer circuit board as claimed in claim 2, wherein said refractory metal is tungsten.

4. A multi-layer circuit board as claimed in claim 3, wherein said aluminum nitride ceramic particles are uniformly distributed in said mixture in 0.5 to 2.0 wt. percent.

5. A multi-layer circuit board as claimed in claim 4 further comprising a die pad on which a semiconductor chip is to be mounted and a plurality of bonding pads to which bonding wires connected to electrodes on said semiconductor chip are to be bonded, on the surface of an uppermost aluminum nitride ceramic layer.

6. A multi-layer circuit board as claimed in claim 5, wherein each of said aluminum nitride ceramic layers has a thickness of 10 μm to 400 μm.

7. A ceramic circuit board comprising:
 a plurality of ceramic layers stacked and combined as an integrated form having an uppermost layer, said ceramic layers being made of an aluminum nitride ceramic material;

wiring layers interposed at different levels between said ceramic layers, said wiring layers being made of a mixture of refractory metal and aluminum ceramic particles of 0.5 to 2.0 wt. percent;

through-holes formed in said ceramic layers to interconnect said wiring layers in different levels, said through-holes being filled with said mixture;

a die pad formed on the surface of the uppermost ceramic layer;

a plurality of bonding pads formed on said surface of said uppermost ceramic layer; and a plurality of additional through-holes formed in said uppermost ceramic layer and filled with said mixture to connect said bonding pads to at least one of said wiring layers.

* * * * *